(12) United States Patent
Hashimoto et al.

(10) Patent No.: US 7,898,889 B2
(45) Date of Patent: Mar. 1, 2011

(54) NONVOLATILE SEMICONDUCTOR MEMORY DEVICE

(75) Inventors: Toshifumi Hashimoto, Yokohama (JP); Takuya Futatsuyama, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 12/408,273

(22) Filed: Mar. 20, 2009

(65) Prior Publication Data

US 2009/0279356 A1 Nov. 12, 2009

(30) Foreign Application Priority Data

May 12, 2008 (JP) .............................. 2008-124471

(51) Int. Cl.
*G11C 7/02* (2006.01)
(52) U.S. Cl. ............ 365/210.1; 365/185.2; 365/189.02; 365/230.02; 365/230.06
(58) Field of Classification Search .............. 365/210.1, 365/185.2, 189.02, 230.02, 230.06
See application file for complete search history.

(56) References Cited

U.S. PATENT DOCUMENTS

| | | | |
|---|---|---|---|
| 6,388,921 B1 | 5/2002 | Yamamoto et al. | |
| 6,735,120 B2 * | 5/2004 | Homma et al. | 365/185.2 |
| 7,158,419 B2 | 1/2007 | Lee et al. | |
| 7,263,000 B2 | 8/2007 | Hazama et al. | |
| 7,272,049 B2 * | 9/2007 | Kang et al. | 365/185.2 |
| 7,504,724 B2 | 3/2009 | Futatsuyama | |
| 7,518,920 B2 * | 4/2009 | Kang | 365/185.17 |
| 2006/0244013 A1 | 11/2006 | Matsunaga et al. | |
| 2008/0084728 A1 | 4/2008 | Sakuma et al. | |
| 2009/0021982 A1 | 1/2009 | Matsunaga et al. | |

FOREIGN PATENT DOCUMENTS

JP 2005-235260 9/2005

* cited by examiner

*Primary Examiner*—Pho M Luu
(74) *Attorney, Agent, or Firm*—Oblon, Spivak, McClelland, Maier & Neustadt, L.L.P.

(57) ABSTRACT

A memory includes first selective transistors connected between one end of cell strings and bit lines; second selective transistors connected between the other end of the cell strings and a cell source line; a dummy cell string; a first dummy selective transistor connected between one end of the dummy cell string and a dummy bit line and whose gate is connected to a first selective gate line; a second dummy selective transistor connected between the other end of the dummy cell string and the cell source line and whose gate is connected to a second selective gate line, wherein at a time of writing in a selected memory cell, a voltage of a first dummy bit line selected is driven to a different voltage from a voltage of an unselected bit line, and any of the dummy cell transistors connected to the first dummy bit line is written.

18 Claims, 6 Drawing Sheets

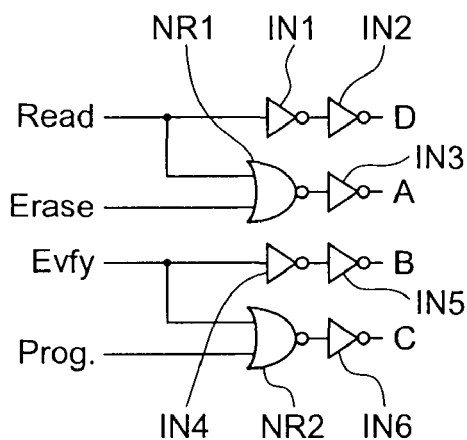
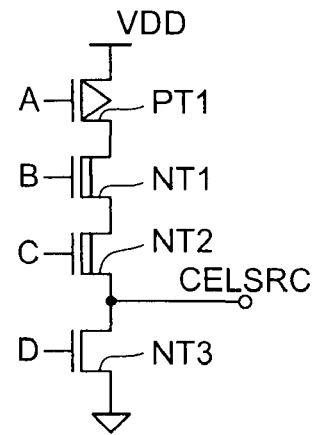
FIG. 2A  FIG. 2B
|  | READ (Read) | WRITE (Prog.) | ERASE (Erase) | ERASE VERIFY (Evfy) |
|---|---|---|---|---|
| A | 1 | 0 | 1 | 0 |
| B | 0 | 0 | 0 | 1 |
| C | 0 | 1 | 0 | 1 |
| D | 1 | 0 | 0 | 0 |
| CELSRC | 0V | VSRC | FLOATING | VDD |
FIG. 3

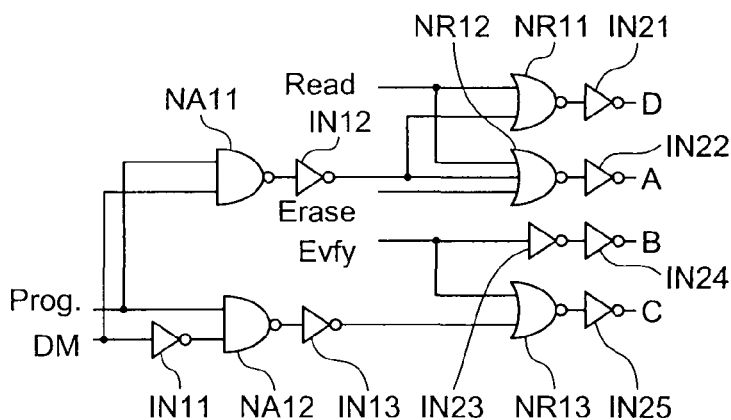 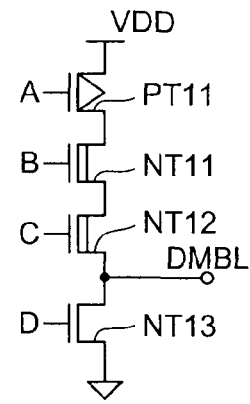
FIG. 4A     FIG. 4B
| | READ | WRITE (Prog.) | | ERASE | ERASE VERIFY (Evfy) |
|---|---|---|---|---|---|
| | | NON DUMMY WRITE (DM=0) | DUMMY WRITE (DM=1) | | |
| A | 1 | 0 | 1 | 1 | 0 |
| B | 0 | 0 | 0 | 0 | 1 |
| C | 0 | 1 | 0 | 0 | 1 |
| D | 1 | 0 | 1 | 0 | 0 |
| DMBL | 0V | VSRC | 0V | FLOATING | VDD |
FIG. 5

NONVOLATILE SEMICONDUCTOR MEMORY DEVICE

CROSS-REFERENCE TO RELATED APPLICATION

This application is based upon and claims the benefit of priority from the prior Japanese Patent Applications No. 2008-124471, filed on May 12, 2008, the entire contents of which are incorporated herein by reference.

BACKGROUND OF THE INVENTION

1. Field of the Invention

The present invention relates to a nonvolatile semiconductor memory device.

2. Related Art

In nonvolatile semiconductor memory devices such as NAND flash memories, a memory cell is processed in the finest manner on chips. When a fine pattern is to be formed in the memory cell, however, it is influenced by adjacent patterns. Because periodicity of the processing is disturbed particularly at the ends of the memory cells, it is difficult to perform the processing as designed.

To realize accurate processing at the end of the memory cell so as to have the same periodicity as that of the center of the memory cell, dummy cell arrays, on which no actual data recording is performed, are located to be adjacent to the ends of cell arrays.

The memory cell is influenced by operations of surrounding cells through a capacitive coupling of its floating gate because of its configuration. Thus, a threshold of a memory cell transistor may vary and accurate operations cannot be performed.

To make the influence of the adjacent cells upon a memory cell at the center of the cell array equal to the influence upon a memory cell at the end thereof, dummy cells that operate in the same manner as the memory cells used for storing data have to be located at the ends of the cell array.

A word line WL/a drain side selective gate line SGD/a source side selective gate line SGS of the dummy cell are connected to a word line WL/a drain side selective gate line SGD/a source side selective gate line SGS of the memory cell. The same voltages as in actual operating units are thus applied. The dummy cell is configured to share the same P-well with the memory cell. The same substrate voltage as in the memory cell is applied to the dummy cell.

SUMMARY OF THE INVENTION

A nonvolatile semiconductor memory device according to an embodiment of the present invention comprises a plurality of word lines along a first direction; a plurality of bit lines along a second direction crossing the first direction; a plurality of memory cell transistors whose gates are connected to the word lines and that are serially connected to constitute a plurality of cell strings; a first selective gate line along the first direction; a second selective gate line along the first direction; a cell source line along the first direction; a plurality of first selective transistors connected between one end of the cell strings and the bit lines and whose gates are connected to the first selective gate line; a plurality of second selective transistors connected between the other end of the cell strings and the cell source line and whose gates are connected to the second selective gate line; a plurality of dummy cell transistors arranged along the second direction and serially connected to each other to constitute at least one dummy cell string; at least one dummy bit line along the second direction; at least one first dummy selective transistor connected between one end of the dummy cell string and the dummy bit line and whose gate is connected to the first selective gate line; at least one second dummy selective transistor connected between the other end of the at least one dummy cell string and the cell source line and whose gate is connected to the second selective gate line; a cell source driver for supplying a cell source voltage to the cell source line; and a dummy bit driver for supplying a voltage to the dummy bit line, wherein at a time of writing in a selected memory cell transistor, a voltage of a first dummy bit line selected from the dummy bit lines is driven to a different voltage from a voltage of an unselected bit line, and any of the dummy cell transistors connected to the first dummy bit line is written.

BRIEF DESCRIPTION OF THE DRAWINGS

FIG. 2A shows a configuration example of a logic circuit in the cell source line driver CSD;

FIG. 2B shows a configuration example of a voltage output unit in the cell source line driver CSD;

FIG. 3 is an explanatory diagram showing logic levels and output signals of the respective signal of the sell source driver;

FIG. 4A shows a configuration example of a logic circuit in the dummy bit line driver DBD;

FIG. 4B shows a configuration example of a voltage output unit in the dummy bit line driver DBD;

FIG. 5 is an explanatory diagram showing logic levels and output signals of the respective signal of the dummy bit line driver;

DETAILED DESCRIPTION OF THE INVENTION

Embodiments of the present invention will be explained below in detail with reference to the accompanying drawings.

(1) First Embodiment

A nonvolatile semiconductor memory device according to a first embodiment of the present invention is explained below.

Figure 1:
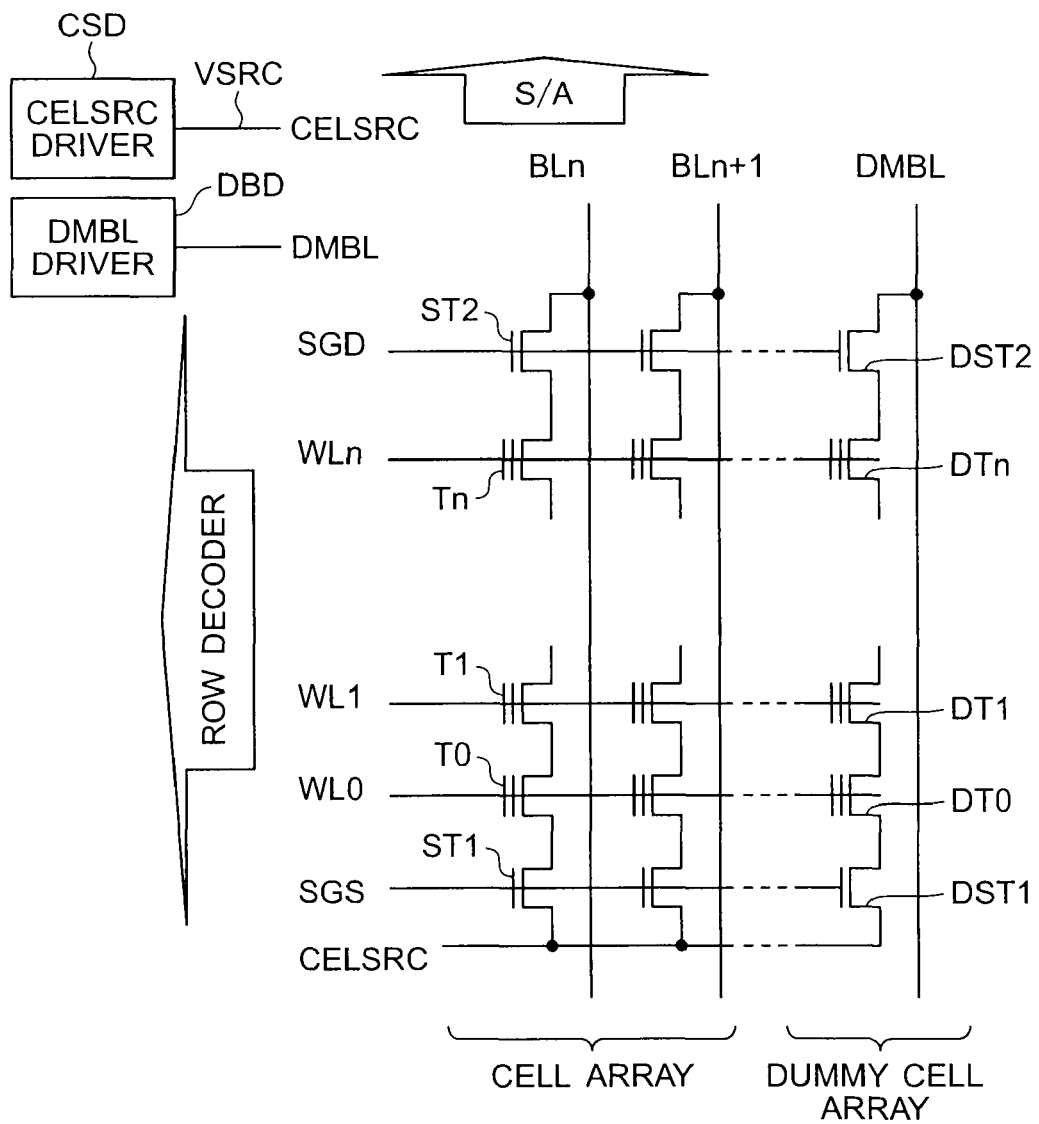
FIG. 1 shows configurations of a nonvolatile semiconductor memory of the first embodiment.

FIG. 1 shows configurations of a cell array and a dummy cell array in a NAND flash memory of the first embodiment.

In the cell array, a plurality of transistors each of which has a floating gate and a control gate are serially connected to each other (in the vertical direction of FIG. 1). A column constituted by the serially connected memory cell transistors is called a cell string. Selective transistors ST1 and ST2 are located at the ends of the cell string, respectively. n+1 (n is an integer equal to or larger than 1) memory cell transistors T0 to Tn are located between the selective transistors ST1 and ST2.

A source of the selective transistor ST1 is connected to a common cell source line CELSRC. A drain of the selective transistor ST2 is connected to a bit line BL which is then connected to a sense amplifier S/A. Such a configuration is provided for n+2 bit lines BL0 to BLn and BLn+1, respectively. That is, the cell string is connected via the selective transistor ST1 to the cell source line CELSRC and via the selective transistor ST2 to the bit line BL.

A dummy cell array located at an end of the cell array has the same configuration as that of the cell array. That is, a plurality of the memory cell transistors each of which has the floating gate and the control gate are serially connected to each other. A column constituted by the serially connected dummy memory cell transistors is called a dummy cell string. Dummy selective transistors DST1 and DST2 are located at the ends of the dummy cell string, respectively. n+1 (n is an integer equal to or larger than 1) dummy cell transistors DT0 to DTn are located between the dummy selective transistors DST1 and DST2. The dummy cell string is thus connected via the selective transistor DST1 to the cell source line CELSRC and via the selective transistor DST2 to the bit line BL.

A source of the dummy selective transistor DST1 is connected to the common cell source line CELSRC. A drain of the dummy selective transistor DST2 is connected to a dummy bit line DMBL which is then connected to the sense amplifier S/A.

Gates of n+2 selective transistors ST1 located for the respective bit lines BL0 to BLn+1 in the horizontal direction of FIG. 1 and of the dummy selective transistor DST1 are connected to a source side selective gate line SGS. Gates of n+2 selective transistors ST2 and of the dummy selective transistor DST2 are similarly connected to a drain side selective gate line SGD.

Similarly, gates of n+2 memory cell transistors T0 and of the dummy cell transistor DT0 are connected to a word line WL0 and gates of n+2 memory cell transistors T1 and of a dummy cell transistor DT1 are connected to a word line WL1. Such a configuration is provided for word lines WL2 to WLn–1. Gates of n+2 memory cell transistors Tn and of a dummy cell transistor DTn are connected to a word line WLn.

The word lines WL0 to WLn, the source side selective gate line SGS, the drain side selective gate line SGD, the cell source line CELSRC, and a semiconductor substrate in the dummy cell array are common to the cell array.

A cell source line driver CSD generates a cell source line voltage VSRC to be applied to the cell source line CELSRC and then supplies it to the cell source line CELSRC.

A dummy bit line driver DBD generates a voltage DMBL for driving the dummy bit line DMBL in the dummy cell array and then supplies it to the dummy bit line DMBL. The dummy bit line driver DBD outputs the same cell source line voltage VSRC as in the cell source line driver CSD in operational modes other than a write operation. The dummy bit line driver DBD outputs 0 V to selected cells and the voltage VSRC to unselected cells in the write operation.

Biased states of the memory cell array and the dummy cell array in the various operations are described below.

WL denotes the word line, SGD denotes the drain side selective gate line, SGS denotes the source side selective gate line, CELSRC denotes the cell source line, VSRC denotes the cell source line voltage, S/A denotes the sense amplifier, BL denotes the bit line, DMBL denotes the dummy bit line, VPASS denotes a miswriting preventing voltage, VPGM denotes a programming voltage, VERA denotes a substrate voltage, and VDD denotes a supply voltage.

1. Read (1a) Memory Cell Array
 WL: 0 V (unselected)/VREAD (=5 V) (selected)
 SGD/SGS: VSG/VSG (=4 V)
 Semiconductor Substrate: 0 V
 CELSRC: 0 V
 BL: 0.7 V (S/A detects whether discharge occurs)

(1b) Dummy Cell Array
 WL: 0 V (unselected)/VREAD (selected)
 SGD/SGS: VSG/VSG (=4 V)
 Semiconductor Substrate: 0 V
 CELSRC: 0 V
 DMBL: 0 V (=memory cell's CELSRC)

2. Write (2a) Memory Cell Array
 WL: VPASS (=10 V) (unselected)/VPGM (=20 V) (selected)
 SGD=VSGD (=2.5 V), SGS=0 V
 Semiconductor Substrate: 0 V
 CELSRC: VSRC (=2.5 V)
 BL: 0 V (selected)/VDD (=2.5 V) (unselected)

(2b) Dummy Cell Array
 WL: VPASS (unselected)/VPGM (selected)
 SGD/SGS: VSGD (unselected)/0 V (selected)
 Substrate: 0 V
 CELSRC: VSRC
 DMBL: VSRC (=memory cell's CELSRC) (unselected)/0 V (selected)

(During writing, selected cell is in a biased state for writing)

3. Erase (3a) Memory Cell Array
 WL: 0 V
 SGD/SGS: Floating
 Semiconductor Substrate: VERA (20 V)
 CELSRC: Floating
 BL: Floating (Dummy cell is in the same biased state as memory cell)

(3b) Dummy Cell Array
 WL: 0 V
 SGD/SGS: Floating
 Substrate: VERA
 CELSRC: Floating
 DMBL: Floating (=memory cell's CELSRC)

4. Erase Verify (4a) Memory Cell Array
 WL: 0 V
 SGD/SGS: VDD
 Semiconductor Substrate: 0 V
 CELSRC: VDD (S/A detects potential changes in BL)

(4b) Dummy Cell Array
 WL: 0 V
 SGD/SGS: VDD
 Semiconductor Substrate: 0 V
 CELSRC: VDD
 DMBL: VDD (=memory cell's CELSRC)

The write operation is performed by implanting electrons in the floating gate employing an FN tunneling phenomenon caused by high electric field between the control gate and a channel region, so that a cell's threshold is made to be changed. In the memory cell array, a voltage difference is generated in the channel region by the potential of the bit line BL (0 V), so that writing is performed.

In the dummy cell array, the channel region in the unselected cell has the cell source line voltage VSRC not 0 V because of the dummy bit line DMBL and thus the voltage difference is not generated. Writing is not therefore performed. Meanwhile, the channel region in the selected cell has 0 V because of the dummy bit line DMBL. Therefore, the voltage difference is generated and writing is performed.

The memory cell array and the dummy cell array are in the same biased state during an erase operation. Erase is thus performed in the dummy cell array during the erase operation.

Writing is performed in the dummy cell array similarly to the memory cell array.

Thus, a series of phenomena is avoided that, when a memory operation including read, write, and erase operations is continued, over-erasing occurs in the dummy cell array, electrons are not implanted in but drawn from the floating gate, the potential of the floating gate continues to be increased, and such a strong electric field is applied particularly to a tunneling oxide film and an IPD (inter-poly dielectric) film that they are broken.

In the read operation and erase verify operations, the sense amplifier senses a current flowing in the memory cell array. Thus, the electrons are not implanted in or discharged from the floating gate via the tunneling oxide film. Because the dummy bit line DMBL and the cell source line CELSRC have the same potential in the dummy cell array, a current does not flow in the dummy cell array.

Output voltages of the cell source line driver CSD and the dummy bit line driver DBD depending on the operational modes are picked out and shown below.

(A) Output Voltage of Cell Source Line Driver CSD
  Read: 0 V
  Write: VSRC
  Erase: floating
  Erase Verify: VDD (B) Output Voltage of Dummy Bit Line Driver DBD
  Read: 0 V
  Write: VSRC (unselected)/0 V (selected)
  Erase: floating
  Erase Verify: VDD The dummy bit line driver DBD outputs 0 V to the selected cell and the voltage VSRC to the unselected cell during writing. The dummy bit line driver DBD outputs the same voltage as in the cell source line driver CSD during the other operations.

As described above, the dummy bit line DMBL of the dummy cell connected to the same word line as the selected memory cell is made to have 0 V and writing is performed. Electrons are thus implanted in the floating gate of the selected dummy cell. Because the dummy bit line DMBL has the voltage VSRC in the unselected dummy cell, writing is not performed.

FIG. 2A shows a configuration example of a logic circuit in the cell source line driver CSD, and FIG. 2B shows a configuration example of a voltage output unit in the cell source line driver CSD.

The logic circuit has inverters IN1 to IN6 and NOR circuits NR1 and NR2. In the circuit, a read signal Read during reading, an erase signal Erase during erasing, an erase verify signal Evfy during an erase verify operation, and a programming signal Prog. during writing have a logic "1". Accordingly, logic levels of output signals A, B, C, and D in the respective operational modes are determined as shown in FIG. 3.

The voltage output unit includes a P-channel MOS transistor PT1, depletion N-channel MOS transistors NT1 and NT2, and an N-channel MOS transistor NT3 that are serially connected between a power supply terminal VDD and a ground terminal. The signals A, B, C, and D are inputted to their gates, respectively. The cell source line voltage VSRC is outputted to the cell source line CELSRC connected to a connection of a source of the transistor NT2 and a drain of the transistor NT3.

As a result, 0 V during reading, the voltage VSRC during writing, the floating state during erasing, and the supply voltage VDD during an erase verify operation are outputted to the cell source line CELSRC.

FIG. 4A shows a configuration example of a logic circuit in the dummy bit line driver DBD. FIG. 4B shows a configuration example of a voltage output unit in the dummy bit line driver DBD.

The logic circuit has inverters IN11 to IN13 and IN21 to IN25, NAND circuits NA11 and NA12, and NOR circuits NR11 to NR13. A read signal Read during reading, an erase signal Erase during erasing, an erase verify signal Evfy during an erase verify operation, and a dummy programming signal Prog.DM during writing have a logic "1". The logic levels of the output signals A, B, C, and D in the various operational modes are thus determined as shown in FIG. 5.

The voltage output unit has a P-channel MOS transistor PT11, depletion N-channel MOS transistors NT11 and NT12, and an N-channel MOS transistor NT13 that are serially connected between the power supply terminal VDD and the ground terminal. The signals A, B, C, and D are inputted to their gates, respectively. The dummy bit line DMBL is connected to a connection of a source of the transistor NT12 and a drain of the transistor NT13.

As a result, as the dummy bit voltage DMBL, 0 V is outputted during reading, the voltage VSRC is outputted to the unselected cell and 0 V is outputted to the selected cell during writing, the floating state is outputted during erasing, and the supply voltage VDD is outputted during an erase verify operation.

According to the first embodiment, during writing in the cell array, a voltage of 0 V is applied to the dummy bit line so that writing is performed upon the dummy cell. A series of phenomena can be prevented that a large electric field is applied to the tunneling oxide film and the IPD film by over-erasing resulting in troubles.

(2) Second Embodiment

A nonvolatile semiconductor memory device according to a second embodiment of the present invention is explained below.

Figure 6:
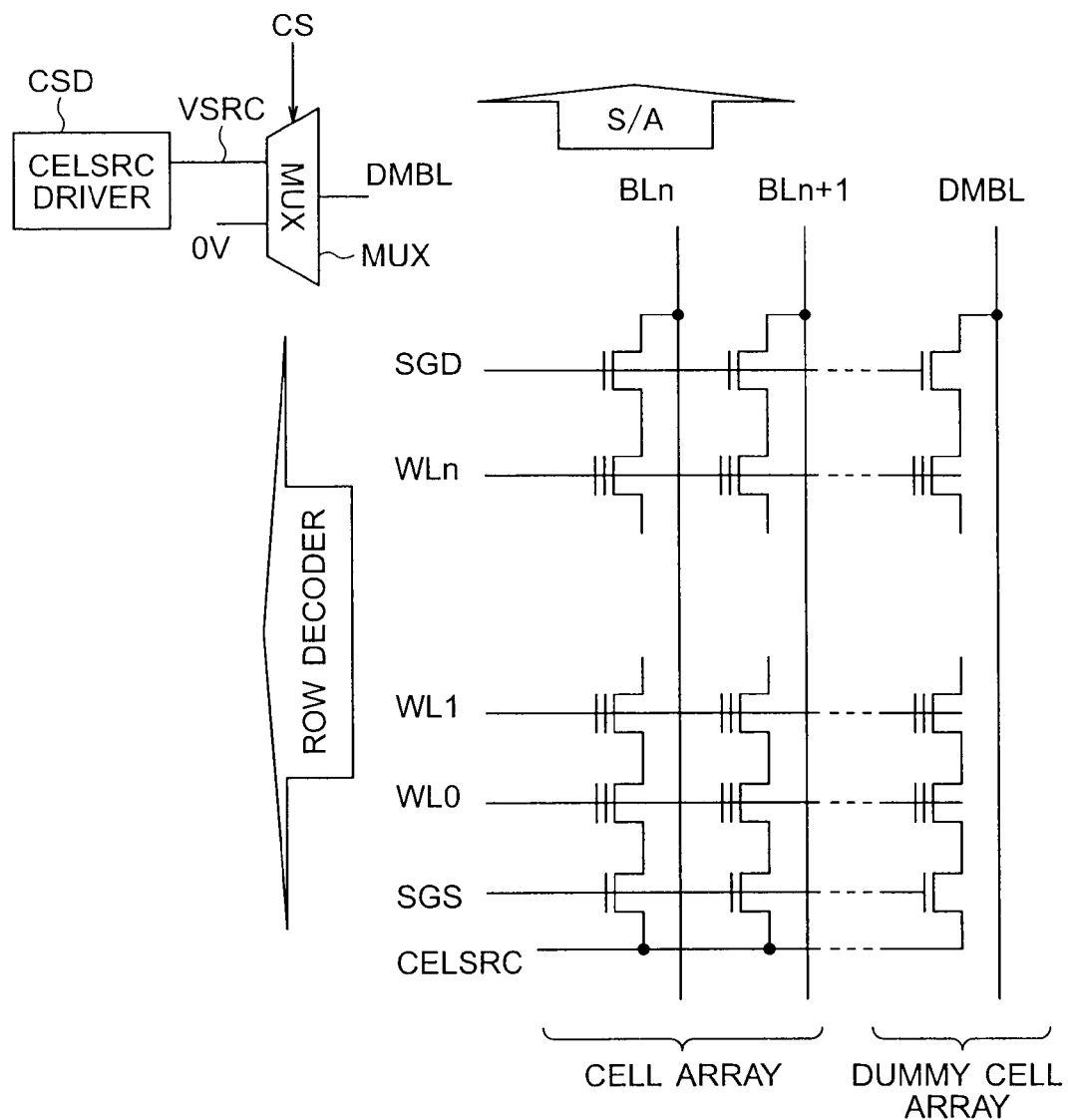
FIG. 6 shows configurations of a nonvolatile semiconductor memory of the second embodiment.

FIG. 6 shows configurations of a cell array and a dummy cell array in the NAND flash memory according to the second embodiment and a cell source line driver CSD.

According to the first embodiment, the dummy bit line driver DBD for generating the dummy bit line voltage DMBL is provided independently of the cell source line driver CSD for generating the cell source line voltage VSRC.

On the contrary, a driver for generating the dummy bit line voltage DMBL is not provided in the second embodiment. The second embodiment is different from the first embodiment in that a multiplexer MUX which switches between the output voltage VSRC from the cell source line driver CSD generating the cell source line voltage VSRC and a voltage of 0 V is provided.

Because the configurations of the cell array and the dummy cell array are the same as in the first embodiment, explanations thereof will be omitted.

The cell source line voltage VSRC outputted from the cell source line driver CSD and 0 V are provided to the multiplexer MUX as described above, switched by a control signal CS, and the switched one is outputted to be applied to the dummy bit line DMBL.

The cell source line voltage VSRC during the operations other than the write operation, 0 V for the selected cell and the cell source line voltage VSRC for the unselected cell during writing are selected, outputted, and applied from the multiplexer MUX to the dummy bit line DBL.

According to the second embodiment, the write operation is performed for the dummy cell during writing in the cell array as in the first embodiment. It is thus possible to reduce stresses of the insulating films caused by over-erasing and avoid problems.

(3) Third Embodiment

A nonvolatile semiconductor memory device according to a third embodiment of the present invention is explained below.

The circuit configuration of the third embodiment is identical to the configuration of the first or second embodiment, and therefore explanations thereof will be omitted.

As the distance between adjacent memory cells in the memory cell array is short, when the threshold of the adjacent memory cell transistor varies, the threshold of the current memory cell also varies by capacitive coupling.

Figure 7:
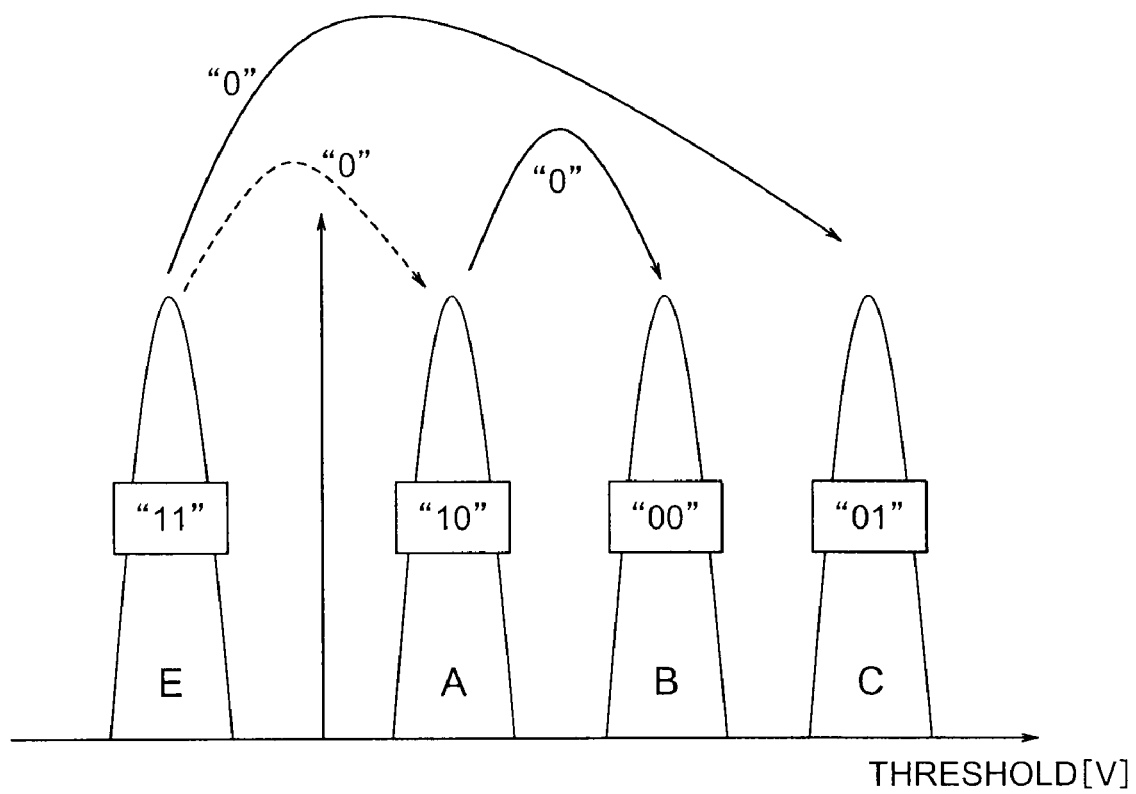
FIG. 7 is an explanatory diagram showing a distribution of threshold values at a time writing a multi-valued data.

Assume that when data to be stored is multivalued, four values including an E level with the lowest threshold, an A level, a B level, and a C level with the highest threshold are provided as shown in a graph of FIG. 7 that shows a threshold distribution. Each level corresponds to 2-bit data, and for example, the E level corresponds to "11", the A level corresponds to "10", the B level corresponds to "00", and the C level corresponds to "01".

The E and A levels with lower thresholds correspond to lower data. The B and C levels with higher thresholds correspond to upper data. At the time of the write operation, the biased state described in the first embodiment is set so that the write operation always starts from the E level with the lowest threshold and proceeds to any of other A, B, and C levels, and electrons are implanted in the floating gates accordingly. The thresholds are controlled by adjusting the writing time or the number of writes. When the written data is erased, it returns to the E level.

When the data of the E level with the lowest threshold is written and then the data of the A level with the second lowest threshold is written as shown in FIG. 7, a threshold variation is small. Because the influence of the threshold variation upon the adjacent memory cell transistor caused by the capacitive coupling is small, problems do not occur. That is, when the lower data is written, problems about the influence of the threshold variation upon the adjacent memory cell transistor do not occur.

When the data of the E level is written and then the upper data with higher threshold, i.e., the data of the B or C level is to be written, the threshold varies greatly. This leads to the threshold variation of the adjacent memory cell transistor.

In the third embodiment, writing is performed as described below. The write operation starts from the E level with the lowest threshold as shown in the FIG. 8A. When the lower data of the A level is then to be written, the writing time or the number of writes is controlled so that the write operation reaches the A level directly as shown in FIG. 8B.

Figure 8A:
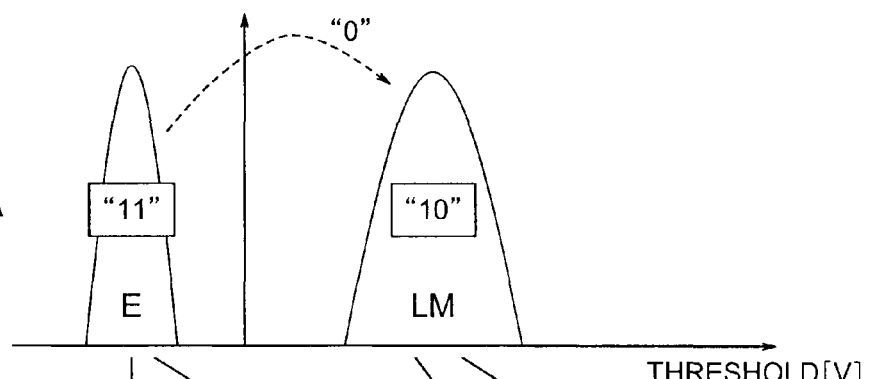
FIGS. 8A and 8B are explanatory diagrams showing a writing scheme of a multi-valued data in a nonvolatile semiconductor memory of the third embodiment.

When the upper data of the B or C level is to be written, the data of the B or C level is not written directly but data of a lower middle level LM is temporarily written as shown in FIG. 8A. The lower middle level LM is located between the A level and the B level.

Figure 8B:
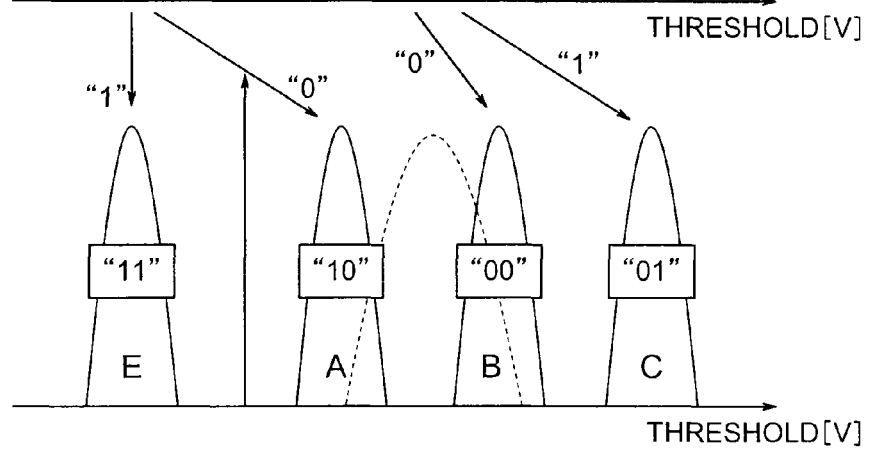

The write operation is then performed by controlling the writing time or the number of writes to reach the B or C level as shown in FIG. 8B.

As described above, when the upper data is written, the data of the lower middle level LM is temporarily written and then the data of the B or C level is written. Because the threshold variations from the E level to the lower middle level LM and from the lower middle level LM to the B or C level are small, the influence upon the threshold of the adjacent memory cell transistor is so small that problems do not arise.

When multivalued data is written in the dummy cells at the ends of the cell array, the same write operation as in the memory cell transistor is performed not to vary the threshold of a memory cell transistor adjacent to the dummy cell.

That is, when the data of the E level and then the lower data of the A level are written in the memory cell transistor in the cell array, the write operation is performed for a dummy cell connected to any dummy bit line connected to the same word line to reach the A level directly. If the upper data of the B or C level is written in the memory cell transistor in the cell array, the data of the lower middle level LM is temporarily written in the dummy cell connected to the same word line. The write operation for the dummy cell stops at the data of the lower middle level LM.

Like the memory cell transistor in the cell array, however, after the data of the lower middle level LM is written, the data of the B or C level can be written in the dummy cell.

Such a write operation for the dummy cell suppresses the influence of threshold variation of the dummy cell upon the threshold of the memory cell transistor adjacent to the dummy cell.

When the erase operation is performed, the thresholds of all memory cell transistors and dummy cell transistors return to the E level. Large distribution of the E level threshold causes variations in the writing time or the number of writes before reaching the A, B, or C level. To prevent such problems, preprogramming that the write operation is performed before erasing for all memory cell transistors in a selected block, e.g., writing of data of levels higher than the C level is performed for not only the memory cell transistor but also a dummy cell connected to the same word line.

To prevent the same problem, software-programming that the write operation with small threshold variation is performed after erasing for all memory cell transistors in the selected block is also performed for the memory cell transistor and the dummy cell transistor.

In the third embodiment, the write operation is performed for the dummy cell array as well as the cell array as in the first and second embodiments. It is thus possible to prevent a series of phenomena that over-erasing occurs in the dummy cell array, a large electric field is applied to the insulating films and thus problems arise, and to improve the reliability of the device.

When the data of the E level and then the upper data of the B or C level are written in the cell array, the data of the lower middle level LM is written in the dummy cell array as well as the cell array in the third embodiment. The influence of threshold variation of the dummy cell transistor exerted upon the memory cell transistor adjacent to the dummy cell transistor via capacitive coupling can be suppressed.

The above embodiments are only exemplary and they can be variously modified within the technical scope of the present invention. For example, one column of the dummy cell array is provided along one dummy bit line at an end of the cell array in the circuit configurations shown in FIGS. 1 and 6. Meanwhile, the dummy cell array can be provided at the other end (not shown), and two or more columns of the dummy cell array can be provided at the ends.

Furthermore, when the write operation is performed for the dummy cell transistor, it is performed for the same writing time or the same number of writes as in the memory cell transistor, or for the shorter writing time or the smaller number of writes than the one in the memory cell transistor. That is, the range of threshold of the dummy cell transistor is the same as or smaller than that of the memory cell transistor to be reached.

Further, when the dummy cell is written, the dummy bit line voltage is set to be the same as the bit line voltage during writing in the memory cell (=0 V) in the above embodiments. However, the dummy bit line voltage does not need to be the same as the bit line voltage, and any voltage that is different from the voltage of a bit line to which a memory cell which is not written is connected and that allows for writing in the dummy cell can be employed. That is, it suffices that the voltage polarity of the selected dummy bit line is shifted to the same voltage polarity as that of the selected bit line, such that the selected dummy cell can be written.

The invention claimed is:

1. A nonvolatile semiconductor memory device comprising:
    a plurality of word lines along a first direction;
    a plurality of bit lines along a second direction crossing the first direction;
    a plurality of memory cell transistors whose gates are connected to the word lines and that are serially connected to constitute a plurality of cell strings;
    a first selective gate line along the first direction;
    a second selective gate line along the first direction;
    a cell source line along the first direction;
    a plurality of first selective transistors connected between one end of the cell strings and the bit lines and whose gates are connected to the first selective gate line;
    a plurality of second selective transistors connected between the other end of the cell strings and the cell source line and whose gates are connected to the second selective gate line;
    a plurality of dummy cell transistors arranged along the second direction and serially connected to each other to constitute at least one dummy cell string;
    at least one dummy bit line along the second direction;
    at least one first dummy selective transistor connected between one end of the dummy cell string and the dummy bit line and whose gate is connected to the first selective gate line;
    at least one second dummy selective transistor connected between the other end of the at least one dummy cell string and the cell source line and whose gate is connected to the second selective gate line;
    a cell source driver for supplying a cell source voltage to the cell source line; and
    a dummy bit driver for supplying a voltage to the dummy bit line, wherein
    at a time of writing in a selected memory cell transistor, a voltage of a first dummy bit line selected from the dummy bit lines is driven to a different voltage from a voltage of an unselected bit line, and any of the dummy cell transistors connected to the first dummy bit line is written.

2. The nonvolatile semiconductor memory device according to claim 1, wherein at the time of writing in the selected memory cell transistor, a voltage of the first dummy bit line is substantially equal to a voltage of a first bit line connected to the selected memory cell transistor.

3. The nonvolatile semiconductor memory device according to claim 2, wherein at the time of writing in the selected memory cell transistor, the number of writing in the selected dummy cell transistor is equal to or smaller than the number of writing in the selected memory cell transistor.

4. The nonvolatile semiconductor memory device according to claim 2, wherein at the time of writing in the selected memory cell transistor, the number of writing in the first dummy cell transistor is equal to or smaller than the number of writing in the selected memory cell transistor.

5. The nonvolatile semiconductor memory device according to claim 2, wherein in a case of writing multi-valued data in the selected memory cell transistor, the multi-valued data including a first value with a lowest threshold, a second value with a higher threshold than that of the first value, a third value with a higher threshold than that of the second value, and a fourth value with a higher threshold than that of the third value, when writing is performed from the first value to the third value or the fourth value, a fifth value between the third value and the fourth value is written, the fifth value is also simultaneously written in the selected dummy cell transistor, and thereafter the fourth value or the fifth value is written in the selected memory cell transistor.

6. The nonvolatile semiconductor memory device according to claim 5, wherein when a write operation is performed before erasing data written in the selected memory cell transistor, the write operation is also performed for the selected dummy cell transistor.

7. The nonvolatile semiconductor memory device according to claim 2, wherein when a write operation is performed before erasing data written in the selected memory cell transistor, the write operation is also performed for the selected dummy cell transistor.

8. The nonvolatile semiconductor memory device according to claim 1, wherein at the time of writing in the selected memory cell transistor, the time for writing in the selected dummy cell transistor is equal to or shorter than the time for writing in the selected memory cell transistor.

9. The nonvolatile semiconductor memory device according to claim 8, wherein in a case of writing multi-valued data in the selected memory cell transistor, the multi-valued data including a first value with a lowest threshold, a second value with a higher threshold than that of the first value, a third value with a higher threshold than that of the second value, and a fourth value with a higher threshold than that of the third value, when writing is performed from the first value to the third value or the fourth value, a fifth value between the third value and the fourth value is written, the fifth value is also simultaneously written in the selected dummy cell transistor, and thereafter the fourth value or the fifth value is written in the selected memory cell transistor.

10. The nonvolatile semiconductor memory device according to claim 8, wherein when a write operation is performed before erasing data written in the selected memory cell transistor, the write operation is also performed for the selected dummy cell transistor.

11. The nonvolatile semiconductor memory device according to claim 1, wherein at the time of writing in the selected memory cell transistor, the number of writing in the selected dummy cell transistor is equal to or smaller than the number of writing in the selected memory cell transistor.

12. The nonvolatile semiconductor memory device according to claim 11, wherein in a case of writing multi-valued data in the selected memory cell transistor, the multi-valued data including a first value with a lowest threshold, a second value with a higher threshold than that of the first value, a third value with a higher threshold than that of the second value, and a fourth value with a higher threshold than that of the third value, when writing is performed from the first value to the third value or the fourth value, a fifth value between the third value and the fourth value is written, the fifth value is also simultaneously written in the selected dummy cell transistor, and thereafter the fourth value or the fifth value is written in the selected memory cell transistor.

13. The nonvolatile semiconductor memory device according to claim 11, wherein when a write operation is performed before erasing data written in the selected memory cell transistor, the write operation is also performed for the selected dummy cell transistor.

14. The nonvolatile semiconductor memory device according to claim 1, wherein in a case of writing multi-valued data in the selected memory cell transistor, the multi-valued data including a first value with a lowest threshold, a second value with a higher threshold than that of the first value, a third value with a higher threshold than that of the second value, and a fourth value with a higher threshold than that of the third value, when writing is performed from the first value to the third value or the fourth value, a fifth value between the third value and the fourth value is written, the fifth value is also simultaneously written in the selected dummy cell transistor, and thereafter the fourth value or the fifth value is written in the selected memory cell transistor.

15. The nonvolatile semiconductor memory device according to claim 14, wherein when a write operation is performed before erasing data written in the selected memory cell transistor, the write operation is also performed for the selected dummy cell transistor.

16. The nonvolatile semiconductor memory device according to claim 1, wherein when a write operation is performed before erasing data written in the selected memory cell transistor, the write operation is also performed for the selected dummy cell transistor.

17. The nonvolatile semiconductor memory device according to claim 1, wherein at the time of writing in the selected memory cell transistor, a voltage polarity of the first dummy bit line is driven to the same polarity as in the first bit line.

18. The nonvolatile semiconductor memory device according to claim 1, wherein at the time of writing in the selected memory cell transistor, a write operation is performed for the memory cell transistor and the dummy cell transistor connected to a word line selected from the word lines.

* * * * *